United States Patent [19]

McNally et al.

[11] Patent Number: 4,831,634
[45] Date of Patent: May 16, 1989

[54] MODEM BACKPLANE INTERCONNECTIONS

[75] Inventors: Lance McNally, Townsend; Peter Morley, Pepperell, both of Mass.

[73] Assignees: Bull HN Information Systems Inc.; Bull HN Information Systems Australia PTY Limited, both of Billerica, Mass.

[21] Appl. No.: 219,941

[22] Filed: Jul. 15, 1988

[51] Int. Cl.[4] .............................................. H05K 7/10
[52] U.S. Cl. ........................................ 375/8; 307/147; 361/393
[58] Field of Search ................... 375/7, 8; 455/73, 90, 455/128, 347, 349; 361/331, 380, 392, 393, 394, 395, 422, 421; 339/43, 44, 49, 928; 307/11, 42, 147, 148; 379/325, 327, 328, 329, 330

[56] References Cited

U.S. PATENT DOCUMENTS

| | | | |
|---|---|---|---|
| 4,445,048 | 4/1984 | Graham | 307/42 |
| 4,777,615 | 10/1988 | Potash | 361/393 |
| 4,782,245 | 11/1988 | Henry | 307/147 |

*Primary Examiner*—Benedict V. Safourek
*Attorney, Agent, or Firm*—George Grayson; John S. Solakian; Lewis P. Elbinger

[57] ABSTRACT

Data communication equipment, including relay modules and MODEMS, are mounted on etched back planes. Etched conductors transfer communication line signal pairs to the relay modules, from the relay modules to the MODEMS and from the MODEMS to an output connector. Ribbon cables plugged into the output connectors transfer the MODEM output signals to logic boards, which are plugged into an etched VME bus panel. CPU's plugged into the etched VME bush panel receive signals from and transfer signals to the etched VME bus.

6 Claims, 3 Drawing Sheets

MODEM BACKPLANE INTERCONNECTIONS

RELATED APPLICATIONS

The following U.S. patent applications are assigned to the same assignee and are related to the instant application.

1. Resilient Data Communications System by Lance McNally, Anthony J. Booth, and Peter Morley was filed Dec. 23, 1987 and has Ser. No. 07/137,315.

2. Hot Extraction of Logic Boards In An On-Line Communication System by Lance McNally, Peter Morley, and James W. Lotti was filed July 15, 1988 and has Ser. No. 219,958.

BACKGROUND OF THE INVENTION

1. Scope of the Inventions

This invention refers primarily to Data Communications Systems and more specifically to the electrical interconnections of phone lines to MODEMS and the output interconnections from the MODEMS.

2. Description of the Prior Art

Data communications equipment at a central site normally includes many MODEMS connected to electronic circuit equipment. The data communications equipment also receives many pairs of PSTN (Public Switched Telephone Network) or leased communication lines from the communication line provider (e.g., telephone company). Each of the MODEMS as well as the other equipment must receive electrical power at several direct current voltages. To interconnect all of these pieces of equipment requires many individual power and logic cables. The large number of cables required are made for an expensive system that is difficult to assemble and difficult to maintain.

Accordingly, it is an object of the invention to provide an interconnection system with fewer power cables, individual phone lines, and logic cables.

SUMMARY OF THE INVENTION

The data communications system is mounted on a rack assembly having a number of multi-layer etched backplanes. Each backplane has a number of connectors located in such a manner as to receive mating connections from either the component side or the fabrication side. A relay module (CRM)/MODEM backplane has a number of MODEM boards plugged into mating connectors, a relay module board plugged into its pair of connectors, and a number of communication line pairs plugged into its connector.

Etched conductors on the RM/MODEM board transfer communication pairs of signals to the relay module board. Output signals from the relay module board are transferred to their respective MODEMS via etched conductors. The output V.24 channel signals from the MODEMS are transferred to output connectors via etched conductors. Also, power is brought in to the backplane and distributed to selected connector pins via a multi-layer etched backplane.

Also, another backplane has a VME bus in the form of etched conductors. A number of serial input output (SIO) logic boards are plugged into connectors coupled to the VME bus. The SIO boards receive the V.24 channel signals via ribbon cables from the RM/MODEM backplane which are plugged into the edge of the SIO board.

Output signals from the SIO boards are placed on the VME bus and received by CPU's which are also plugged into connectors coupled to the VME bus. The VME bus also includes a ground plane and a voltage plane for distributing power.

DESCRIPTION OF THE PREFERRED EMBODIMENT

Figure 1:
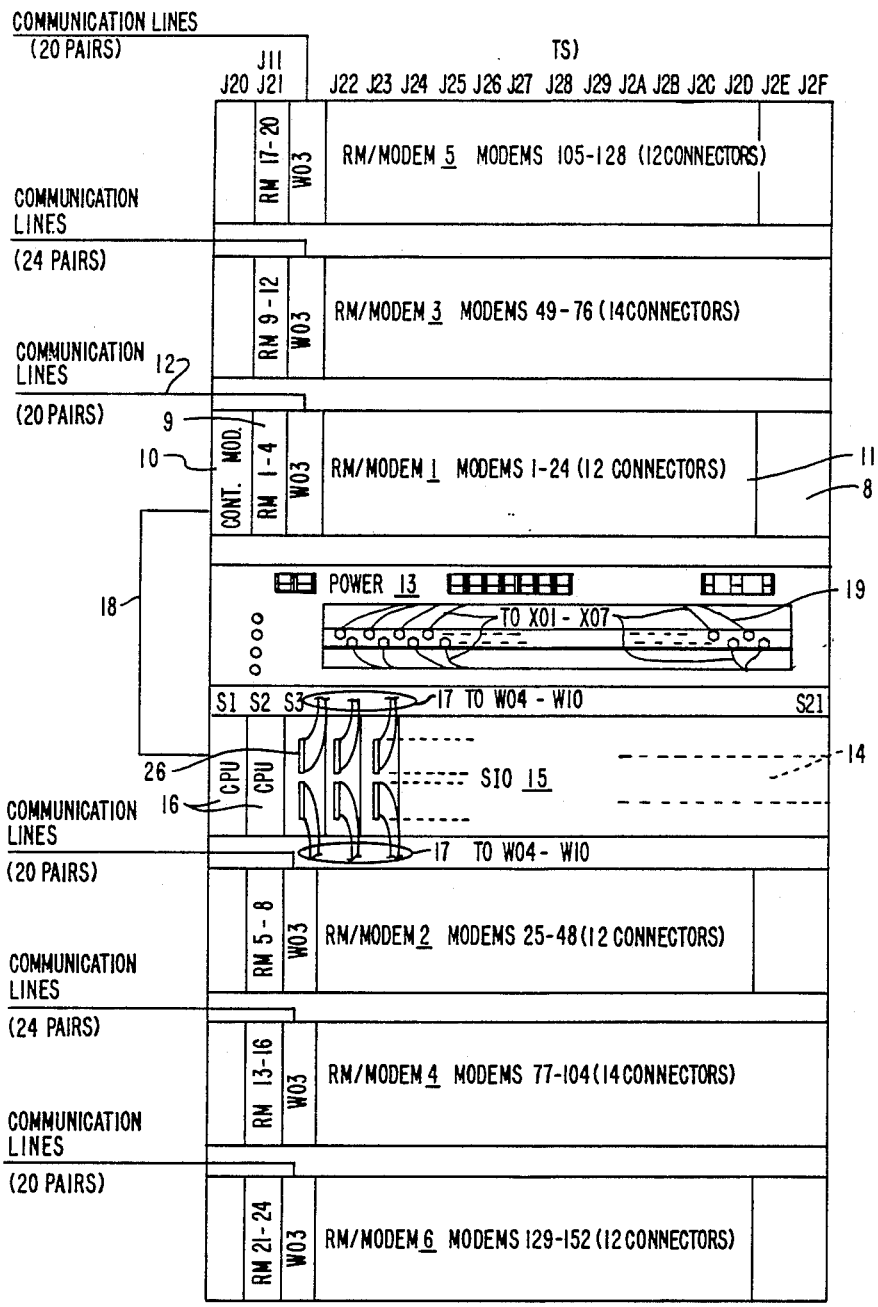
FIG. 1 is a layout of the rack assembly showing the etched backplanes and the backplane interconnections.

FIG. 1 shows the rack assembly 7 which includes a number of assemblies, a relay module (RM)/MODEM 1, an RM/MODEM 2, and RM MODEM 3, an RM/MODEM 4, an RM/MODEM 5, an RM/MODEM 6, a serial input output (SIO) 12, and a Power 13.

Each RM/MODEM 1 through 6 includes a relay module 9 plugged into connectors J11 and J21, and a number of MODEM boards 11 plugged into commercially available DIN connectors J22-J2F (hexadecimal notation) mounted on an etched backplane assembly 8.

A control module board 10 is plugged into a commercially available DIN connector 20 on backplane 8 of RM/MODEM 1 for convenience. Control module board 10 could be plugged into the same connector J20 position on any of the other RM/MODEM's 2 through 6. However, the communication system only requires one control module.

Each modem board 11 contains two MODEMS. RM/MODEM's 3 and 4 each include 28 MODEMS mounted on 14 MODEM boards 11, and RM/MODEMs 1, 2, 5, and 6 each include 12 MODEM boards 11. The number of MODEMS is limited by the number of SIO boards 22 mounted on SIO 12. This is a physical and not a logical limitation.

Twenty pairs of communication lines 12 are terminated in a commercially available IDC (Insulation Displacement Connector) connector and plugged into a mating connector WO3 mounted on the backside of etched backplane 8 of RM/MODEMs 1, 2, 5, and 6. Similarly, twenty-four pairs of communication lines 12 are plugged into their respective connectors WO3 mounted on etched backplane 8 of RM/MODEMS 3 and 4.

Each RM/MODEM 1 through 6 has mounted on the component side of their respective etched backplane 8 a number of commercially available DIN connectors. Control module board 10 is plugged into connector J 20, relay Module 9 is plugged into their respective connectors J11 and J21, the MODEMS boards 11 are plugged into connectors J22 through J2F (hexadecimal notation). The pairs of communication lines are plugged into a commercially available connector WO3 mounted on the backside of each etched backpanel 8.

The logic circuits are described in related U.S. patent application Ser. No. 137,315 entitled "Resilient Data Communication System".

Signals are received from communication lines 12 at each relay module board 9 for transfer to the MODEMS in MODEM boards 11. Relay modules 1 through 4 are are coupled to MODEMS 1 through 24 on RM/MODEM 1. Relay modules 5 through 8 are coupled to MODEMS 25 through 48 of RM/MODEM 2. Relay modules 9 through 12 are coupled to MODEMS 49 through 76 of RM/MODEM 3. Relay modules 13 through 16 are coupled to MODEMs 77 through 104 of RM/MODEM 4. Relay modules 17 through 20 are coupled to MODEMS 105 through 128 of RM/MODEM 5, and relay modules 21 through 24 are coupled to MODEMS 129 through 152 of RM/MODEM 6.

SIO 12 includes VME etched backplane 14 into which are mounted commercially available DIN connectors S1 through S22. Two control processor unit boards (CPU) are plugged into connectors S1 and S2 respectively and nineteen SIO boards 15 are plugged into connectors S3 through S22.

Thirty-eight ribbon cables 17, each terminated in commercially available connectors, are connected between the edge of the nineteen SIO boards 15 and the respective connectors mounted as the backside of etched backplanes 8 of RM/MODEM 1 through 6. Each SIO board 15 therefore is coupled to 2 MODEM boards 11 (4 MODEMS) via one ribbon cable 17.

The output signals (V.24 channel) of each MODEM are applied to a respective SIO board 15 which places corresponding signals to a VME standard over VME bus 14 to CPU's 16. Output signals from CPU 16 are applied to the control module board 10 by a ribbon cable 18 which plugs into a commercially available connector mounted on the backside of RM/MODEM 1. The output signal, from control module board 10 are daisy chained through connectors mounted on the backside of etched backplane 8 of RM/MODEMS 2 through 6. The daily chained cable provides for the geographical addressing of Relay Modules.

Power is provided by power 13 to the etched backplanes 8 and the etched VME backplane 14 via cables 19 which provide +/−12 VDC, +5 VDC and ground. Each etched backplane 8 and 14 includes a ground plane, etched voltage conductors on a logic plane, and a voltage plane for distributing power to the logic boards.

Figure 2:
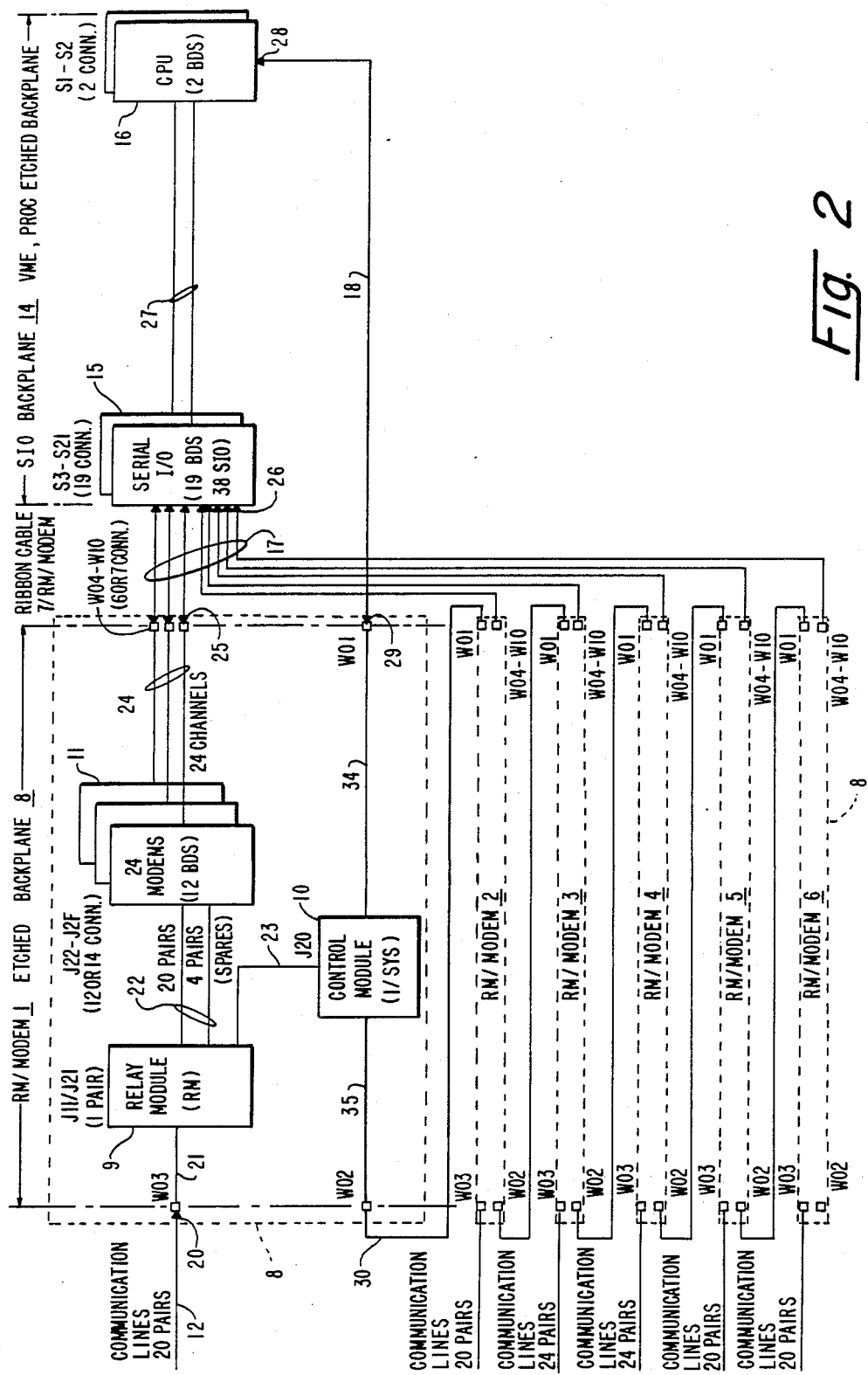
FIG. 2 shows a logic layout of the components plugged into the etched backplane connectors.

FIG. 2 shows, in schematic form, the layout of rack assembly 7 by showing in detail the etched interconnections of RM/MODEM 1 coupled to SIO boards 15 and via the etched VME backplane 14 to CPU's 16

Twenty pairs of communication lines 12 terminating in a connector 20 are plugged into connector WO3. The twenty pairs of communication signals are carried by etched conductors 21 to connectors J11 and J21 for relay module board 9. Twenty-four pairs of output communication signals (4 spare pairs of signals) from connectors J11 and J21 are applied to connectors J22 through J2F via etched conductors 22 for MODEMS boards 11. The output signals of MODEM boards 11 appear as twenty-four V.24 channels which are carried between the twelve connectors J22 through J2F and six connectors W04 through W10 via etched conductors 24. The connectors 25 of ribbon cable 18 are plugged into their respective connectors W04 through W09 for transfer to the SIO boards 15 via edge connectors 26. The VME output signals from SIO boards 15 are transferred to CPU16 via connectors S3 through S21, etched conductors 27 and connectors S1 and S2.

Signals between the CPU boards 16 and control module board 10 are transferred via a connector 28, ribbon cable 18, connector 29, which is plugged into connector W01 and then to connector J20 via etched conductors 34. The daisy-chain signals are applied to the other etched backplanes 8 via connector J20, etched conductors 35, connector W02, ribbon cable 30, connector W01, and so on for this remainder of the daisy chain interconnections.

Etched conductors 25 carry control module board 10 signals between connectors J20 and J11/J21 on each etched backplane 8.

Figure 3:
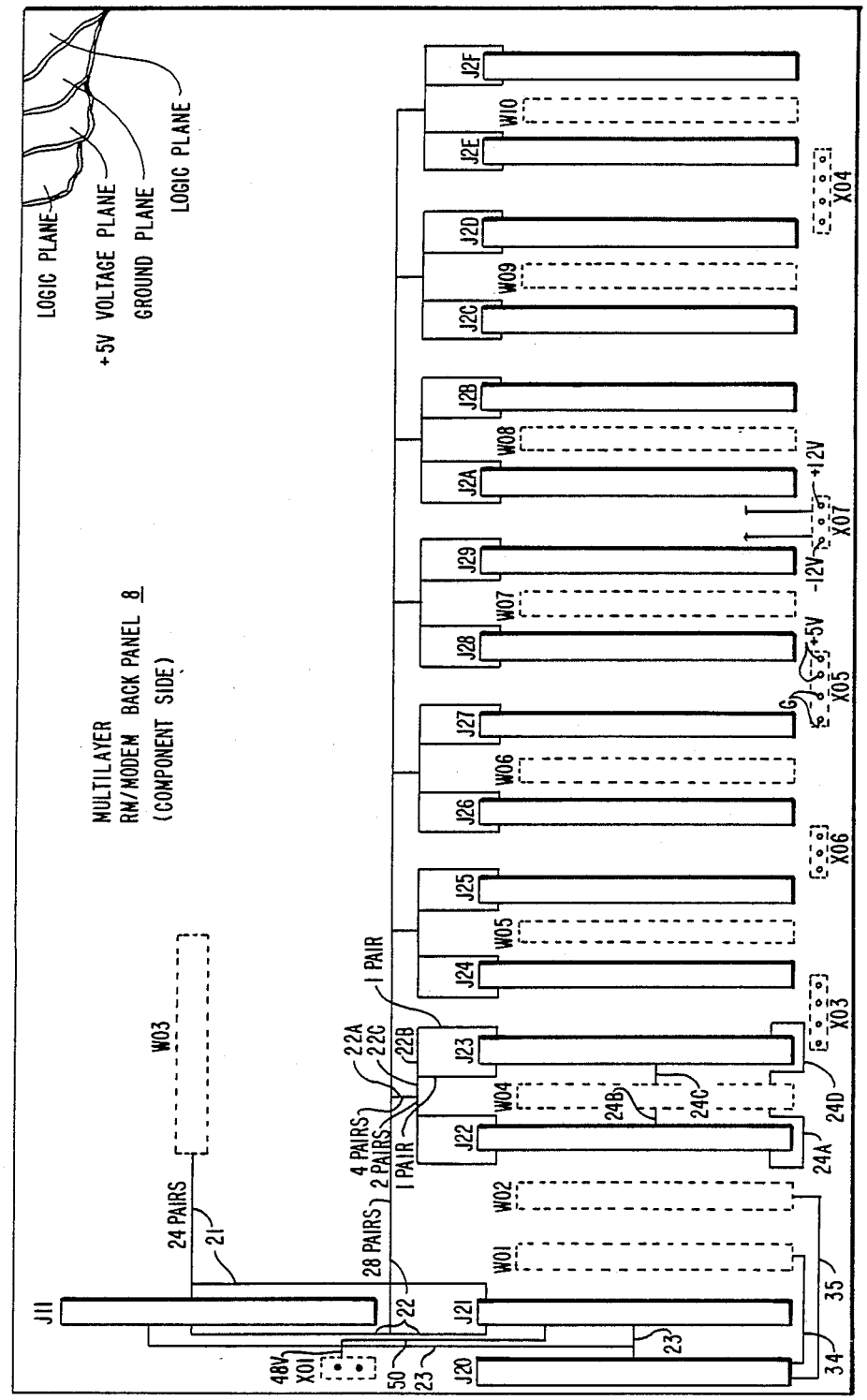
FIG. 3 shows a schematic of the etched conductor connections on the RM/MODEM backplane.

FIG. 3 shows the layout of etched backplane 8 (RM/MODEM 3) as seen from the component side. The connectors Jxx are shown as solid since they are plugged into from the component side. The connectors Wxx are shown dotted since they are plugged into from the fabrication side. Power connectors xxx are also dotted since they are also plugged into from the fabrication side.

The 24 pairs of communication lines 12 are distributed between connectors J11 and J21 by etched conductors 21. The 28 pairs of communication signals that are the output signals of relay modules 9 are distributed to their respective MODEM boards by etched conductors 22 from connectors J11 and J21 to connectors J22 through J2F.

As shown in detail for connectors J22 and J23, conductors 22 feed each pair of adjacent MODEM boards 15 by 4 pairs of conductors 22A, and each MODEM board 15 by 2 pairs of conductors 22C, each MODEM receiving one pair of conductors 22B.

The 28 sets of V.24 channels from the MODEM boards 15 are carried by etched conductor 24 from each pair of adjacent MODEM board connectors Jxx and Jxy to a single connector Wxx. As an example etched conductors 24A and 24B each carry one V.24 channel between connectors W04 and J22. Similarly, etched conductors 24C and 24D each carry one V.24 channel signals between conductors WO4 and J23. This arrangement is repeated for each Wxx connector located between adjacent Jxx and Jxy connectors.

Etched conductors 34 carry control module board 10 signals between connectors W01 and J20 and etched conductors 35 carry control module board signals between connectors W02 and J20. Also etched conductors 23 carry signals between connectors J20 and J11/J21.

Power connector X01 receives +/−48 VDC which is distributed by etched conductors 50 to connector J21. Power connectors X03, X04, and X05 receive +/−12 VDC and ground from power 13 and power connectors X06 and X07 receive +5 VDC from power 13.

Back panel 8 is a multilayer board which includes a ground plane, a +5 VDC voltage plane, and a number of logic planes. The +/−48 VDC and +/−12 VDC are distributed by the etched conductors on the logic plane.

Table 1 shows the ribbon cable 17 interconnections between the SIO boards 15 and the connectors W04 through W10. The asterisks refer to spare SIO and MODEM boards.

Each of the nineteen SiO boards 15 receives the edge connectors of two ribbon cables 17, one edge connector in the top half of the board 15 (1T through 19T) and a second edge connector in the bottom half of the board 15 (1B through 19B). Note that the following SIO boards 15 are identified as spares—1, 8, and 15. Also MODEMS 1-4, 29-32, 57-60, 85-88, 113-116, and 133-136 are identified as spares.

TABLE 1

RIBBON CABLE 17 CONNECTIONS

| TO SIO BOARD 15 EDGE CONNECTOR | FROM RM/MODEM | OUTPUT CONNECTOR | MODEMS |
|---|---|---|---|
| *1T (S3) | 1 | W04 | (1-4) |
| *1B | 2 | W04 | (25-28) |
| 2T (S4) | 1 | W05 | (5-8) |
| 2B | 2 | W05 | (29-32) |
| 3T (S5) | 1 | W06 | (9-12) |
| 3B | 2 | W06 | (33-36) |
| 4T (S6) | 1 | W07 | (13-16) |
| 4B | 2 | W07 | (37-40) |
| 5T (S7) | 1 | W08 | (17-20) |
| 5B | 2 | W08 | (41-44) |
| 6T (S8) | 1 | W09 | (21-24) |
| 6B | 2 | W09 | (45-48) |
| *7T (S9) | 3 | W04 | (49-52) |
| *7B | 4 | W04 | (77-80) |
| 8T (S10) | 3 | W05 | (53-56) |
| 8B | 4 | W05 | (81-84) |
| 9T (S11) | 3 | W06 | (57-60) |
| 9B | 4 | W06 | (85-88) |
| 10T (S12) | 3 | W07 | (61-64) |
| 10B | 4 | W07 | (89-92) |
| 11T (S13) | 3 | W08 | (65-68) |
| 11B | 4 | W08 | (93-96) |
| 12T (S14) | 3 | W09 | (69-72) |
| 12B | 4 | W09 | (97-100) |
| 13T (S15) | 3 | W10 | (73-76) |
| 13B | 4 | W10 | (100-104) |
| *14T (S16) | 5 | W04 | (105-108) |
| *14B | 6 | W04 | (129-132) |
| 15T (S17) | 5 | W05 | (109-112) |
| 15B | 6 | W05 | (133-136) |
| 16T (S18) | 5 | W06 | (113-116) |
| 16B | 6 | W06 | (137-140) |
| 17T (S19) | 5 | W07 | (117-120) |
| 17B | 6 | W07 | (141-144) |
| 18T (S20) | 5 | W08 | (121-124) |
| 18B | 6 | W08 | (145-148) |
| 19T (S21) | 5 | W09 | (125-128) |
| 19B | 6 | W09 | (149-152) |

* = SPARES

We claim:

1. A hardware arrangement of communications equipment for processing signals received from a plurability of pairs of communication lines comprises:
   a plurality of first backplane assemblies, each having a first multilayer backplane on which are mounted a plurality of first connectors on a first side and a plurality of second connectors on a second side;
   a relay module board plugged into a first plurality of said first connectors;
   a plurality of MODEM boards plugged into a second plurality of said first connectors;
   a first of said second connectors for receiving said plurality of pairs of communications lines;
   a plurality of first etched conductors coupled to said first of said second connectors and said first plurality of said first connectors for transferring said signals to said relay module board;
   a plurality of second etched conductors coupled to said first and said second plurality of said first conductors for transferring said signals to said plurality of MODEM boards;
   a plurality of third etched conductors coupled to said second plurality of said first connector and a second plurality of said second connectors for transferring channel signals generated by MODEMS on said MODEM boards to said second plurality of said second connectors.

2. The hardware arrangement of claim 1 further comprising:
   a serial input output (SIO) assembly including an etched VME backplane on which are mounted a plurality of third connectors;
   a plurality of SIO boards plugged into a first plurality of said third connectors, and
   a plurality of CPU boards plugged into a second plurality of said third connectors.

3. The hardware arrangement of claim 2 further comprising:
   a plurality of ribbon cables, each having an edge connector on a first end and a fourth connector on a second end;
   said edge connector of said each of said plurality of ribbon cables being plugged into an end of said SIO boards and said fourth connector being plugged into a respective one of said second plurality of said second connectors.

4. The hardware arrangement of claim 3 wherein said channel signals are received from said plurality of ribbon cables by said SIO boards for generating VME signals;
   said etched VME backplane having a plurality of fourth etched conductors for transferring said VME signals to said CPU boards.

5. The hardware arrangement of claim 4 further comprising:
   power supply means for providing a plurality of voltages;
   cable means coupled to said power supply means for distributing said plurality of voltages and ground;
   each of said plurality of first multilayer backplanes and said etched VME backplane coupled to said cable means and having mounted a plurality of power connectors for receiving said plurality of voltages and said ground, each of said plurality of first multilayer backplanes and said etched VME backplane having a ground plane for distributing said ground and a voltage plane for distributing said plurality of voltages.

6. A panel assembly for terminating communications line pairs and processing signals received from said line pairs comprising:
   a multilayer etched backplane housing;
   a plurality of first connector mounted on a first side and a plurality of second connectors mounted on a second side;
   a first of said plurality of second connectors for terminating said line pairs and receiving said signals;
   a plurality of MODEMS plugged into a first plurality of first connectors;
   a plurality of first conductors coupled to said first of said plurality of second connectors and said first plurality of first connectors for transferring said signals to said plurability of MODEMS, said plurality of MODEMS being responnsive to said signals for generating channel signals;
   a plurality of second connectors mounted on said second side of said multilayer etched backplane;
   a plurality of second conductors coupled to said second plurality of second connectors and said first plurality of first connectors for transferring said channel signals.

* * * * *